United States Patent Office 3,671,240
Patented June 20, 1972

3,671,240

PHOTOGRAPHIC TRANSFER ELEMENTS AND PROCESSES FOR PREPARING AND USING THEM

Eugene P. Gramza and David D. Schreiber, Rochester, N.Y., assignors to Eastman Kodak Company, Rochester, N.Y.

No Drawing. Filed June 10, 1970, Ser. No. 45,219
Int. Cl. G03c 5/54, 1/68
U.S. Cl. 96—29 R 32 Claims

ABSTRACT OF THE DISCLOSURE

Photosensitive elements for use in image transfer processes contain in the light sensitive layer a flocculated pigment which forms a discontinuous phase uniformly distributed in a continuous polymer layer. The light sensitive layer can be prepared by mixing and coating a solution of the light sensitive polymer and a pigment with a surfactant to flocculate the pigment. The resultant element can be used in photothermographic image transfer processes to give images having increased transfer density.

This invention relates to the photographic reproduction of images. In a particular aspect it relates to elements and processes for the preparation of images by processes using a transfer step.

In recent years light sensitive polymers and light sensitive polymer compositions have found widespread acceptance for use in photographic reproduction processes. In a typical procedure, a layer of the light sensitive polymer composition is exposed to actinic radiation to create a differential between the exposed and unexposed areas of the layer. With many light sensitive polymers actinic exposure results in crosslinking and hardening of the polymer in exposed areas of the layer and creates a difference in solubility or melting point between exposed and unexposed areas; although with other polymers or polymer compositions actinic exposure can create other differences between exposed and unexposed areas which can be used to advantage in image reproduction processes. The difference in properties between the exposed and unexposed areas of the layer is the basis for developing an image on the element in accordance with its exposure to actinic radiation.

Differences in solubility have been used more often to develop images. However, in recent years there has been increased interest in, and wider acceptance of processes which utilize for development of an image the differences in softening or tackifying point between the exposed and unexposed areas of the layer. Such photothermographic processes are particularly attractive since they eliminate the need for solvents or other wet chemical processing steps. Such processes are described, for example, in Allen, U.S. application Ser. No. 709,496, filed Feb. 29, 1968.

One photothermographic transfer process which utilizes the difference in tackifying point between the exposed and unexposed areas of a layer to develop an image, involves heating the exposed element and transferring the composition from the lower melting areas of the element to a receptor surface. Optical density is given to the transferred image by incorporating in the light sensitive polymer layer a pigment or dye. Since the preferred pigments and dyes generally absorb radiation in the region of the spectrum to which the light sensitive layer is sensitive, a balance must be achieved between adding sufficient colorant to give good image density yet not adding so much colorant that actinic radiation cannot penetrate throughout the depth of the layer or that inordinately long exposures are required to crosslink the layer. The present invention provides a novel photosensitive element useful in such transfer processes which contains a light sensitive layer having a novel configuration of colorant and polymer which gives improved transfer density, and novel processes for preparing and using such elements.

Accordingly, it is an object of this invention to provide novel photosensitive elements.

It is a further object of this invention to provide novel photothermographic elements which give increased image transfer density in photothermographic transfer processes.

It is still a further object of this invention to provide pigmented image transfer elements which give high transfer density and permit in depth crosslinking of the light sensitive polymer layer without inordinately long exposures being required.

It is another object of this invention to provide novel processes for preparing these novel photosensitive elements.

It is yet another object of this invention to provide novel processes for the preparation of photographic images by image transfer processes utilizing these novel photosensitive elements.

The above and other objects of this invention will become apparent to those skilled in the art from the further description of the invention which follows.

The photosensitive elements of this invention comprise a support bearing a layer of a photocrosslinkable polymer forming a continuous phase and a flocculated pigment forming a discontinuous phase uniformly distributed in the polymer layer. These elements give increased transfer density compared with similar elements elements not containing the flocculated pigment and, hence, find greatest utility in processes involving a transfer step. However, these elements can be used to advantage in other reproduction processes in which photohardenable polymers are used.

As used herein the term "flocculated pigment" is intended to refer to clusters of individual pigment particles which are held together by relatively weak mechanical forces. Layers having this flocculated or discontinuous structure exhibit a grainy appearance as a result of the clusters of pigment. These clusters of flocculated pigment are of such a size that they will remain in suspension in the coating composition from which the light sensitive polymer layer is formed and thus provide a uniform distribution of the flocculated pigment throughout the polymer layer rather than having the flocculated pigment settle out at the bottom of the layer. While a number of variables will affect the optimum size of the clusters of flocculated pigment, generally a mean diameter in the range of $0.1\mu$ to $10\mu$ will give the desired effect.

Flocculation of the pigment permits crosslinking of the light sensitive polymer layer throughout its depth by opening up channels of unpigmented polymer in the pigmented polymer layer which would otherwise absorb a portion of the exposing radiation. This permits the exposing radiation to penetrate further into the light sensitive layer and eliminates plugging or transfer of polymer from exposed areas of the layer.

Surprisingly, it has been found that the optical density of images transferred from a light sensitive layer having this flocculated structure is greater than the optical density of the light sensitive layer from which the images are transferred. This provides a startling improvement over images transferred from layers not having the flocculated structure, since with those layers the optical density of the transferred image is not greater than the optical density of the element from which it is transferred, and often is less. Thus to obtain a given transfer density, an element having the flocculated structure of the present invention can be employed which has a lower optical density than would be required if the element did not have the flocculated structure. Aside from the saving attributable to the need for less pigment, this results in an effective increase in photographic speed attributable to the channeling effect discussed above. Thus, there are a number of advantages attributable to the flocculated layers of the present invention.

The pigment can be caused to flocculate in a number of ways. For example, flocculation can be accomplished by agitating a solution of the polymer and pigment to cause pigment particles to agglomerate or cluster together. Alternatively, the pigment particles will flocculate if a solution of the polymer and pigment is allowed to sit for a sufficient period of time under the proper conditions. However, such procedures are difficult to control and once flocculation commences growth of the clusters proceeds rapidly and results in the flocculated pigment settling out of the polymer solution. Thus, while such procedures could be used to prepare coating compositions for the use in the present invention, they are not preferred since the possibility of waiting long periods of time of uncertain duration and the need for close control to obtain a useful composition renders these procedures extremely impractical.

A preferred procedure for preparing the flocculated pigment compositions for use in the present invention entails the controlled flocculation of the pigment and involves mixing a surfactant with a solution of the light sensitive polymer and the pigment for a period of time sufficient to flocculate the pigment and cause it to form a discontinuous phase uniformly distributed in the polymer solution. The coating composition thus formed can be coated on a support before the flocculated pigment settles out of the continuous polymer phase, to give an element of the present invention.

The use of a surfactant in sufficient amount shortens the period of time required for the flocculation of the pigment and controls the size of the pigment clusters, thereby postponing, if not eliminating, the flocculate pigment settling out of the polymer solution and increasing the time available to coat the composition on the support.

Mixing of the composition to effect flocculation of the pigment can be accomplished with any equipment which provide gentle agitation for the mixture. Mixing for periods of from 2 to 24 hours is generally sufficient to cause the pigment to flocculate, although longer or shorter periods may be necessary or desirable depending upon other variable in the system such as the specific components employed, the means of agitation, the rate of agitation and the like. As indicated above, the use of a surfactant controls the size of the clusters of flocculated pigment. However, if agitation is continued for too long or too rapidly, the clusters will grow too large and settle out of the solution. Thus some care should be exercised in agitating the mixture to prevent settling out of the flocculated pigment.

A preferred means for mixing the solution to effect flocculation comprises a roll mill which has a closed container in which a solution of the pigmented polymer composition can be tumbled to effect flocculation.

While waiting to be coated, the flocculated pigment composition can continue to be slowly mixed so as to prevent settling out of the discontinuous phase and coating should be effected while the flocculated pigment is still uniformly dispersed through the coating composition. This insures that the flocculated pigment will be similarly dispersed in the light sensitive layer.

Surfactants which can be used to advantage in preparing flocculated pigment compositions in accordance with the present invention can be selected from among a number of commercially available materials. Such materials include ionic surfactants, such as the cation surfactant, N-tallow trimethylene diamine dioleate, as well as polymeric surfactants, such as siloxane polymers and copolymers for example dimethyl polysiloxanes and copolymers of dimethyl polysiloxanes with polyoxyalkylene ethers. Such surfactants are sold commercially under such tradenames as SF-96, SF-1066, SF-1098 and Duomeen TDO. Other surfactants which can be used in the present invention to cause flocculation of the pigment can be selected by those skilled in the art taking into consideration such factors as solubility in the system, the concentration of surfactant which will be required to effect flocculation, the surface tension reduction effect which the surfactant has in different solvent systems, the compatibility of the surfactant with other components of the system, and the like.

A wide number of light sensitive polymers and polymer compositions can be used in the light sensitive elements of this invention. The light sensitive polymers generally contain the light sensitive grouping $$-CH=CH-\overset{\overset{\large O}{\|}}{C}-$$

in the polymer, either as an integral part of the polymer backbone or in a group atached to the polymer backbone. Representative polymers containing this light sensitive grouping are described for example in such patents as Michiels et al. U.S. Pat. 2,956,878, issued Oct. 18, 1960, Schellenberg et al. U.S. Pat. 3,030,208, issued Apr. 17, 1962, and Borden et al. U.S. Pat. 3,453,237 issued July 1, 1969 as well as such U.S. patent applications as Allen U.S. Ser. No. 709,496, filed Feb. 29, 1968, Phlipot et al. U.S. Ser. No. 19,063, filed Mar. 12, 1970 and Laakso et al U.S. Ser. No. 19,064, filed Mar. 12, 1970. Certain of these polymers have suitable thermo-mechanical properties for use in transfer processes without addition of other components to modify the physical properties of the light sensitive layers prepared from them. Others of these polymers require the presence of additional components, such as plasticizers and the like, to impart layers in which they are contained suitable physical properties for use in transfer processes. Such modifications can be made by those skilled in the art in accordance with known procedures.

Particularly preferred for modification in accordance with the present invention are the polyester composition described in Allen U.S. Ser. No. 709,496, filed Feb. 29, 1968 and the photothermographic elements described therein. Such light sensitive compositions are substantially non-tacky at room temperature (20° C.), but have tackifying temperatures (i.e., the temperature at which the composition becomes tacky) of about 50 to 200° C. Typically, these photocrosslinkable polyester compositions have a crystallinity of about 10% to 80% as determined by X-ray diffraction, and a glass transition temperature (Tg) of less than about 30° C., glass transition temperature being that temperature at which the composition in molten state changes to a hard glass state. Suitable polyesters are prepared with 50 mole percent of at least one dihydric alcohol or diol moiety and 50 mole percent of at least two hydroxy-free dicarboxylic acid moieties, about 5 to 45 mole percent, based on the polyester, of the dicarboxylic acid moieties containing as an integral portion a light-sensitive grouping $$-CH=CH-\overset{\overset{\large O}{\|}}{C}-$$

On exposure to actinic radiation these polyesters crosslink to form in the areas of exposure, material having a higher tackifying temperature than the original or unexposed polyester.

A wide variety of diols can be utilized in preparing these light-sensitive polyesters. Typical of the suitable diols are those having the formula HO—R—OH wherein R is a divalent organic radical generally having about 2 to 12 carbon atoms, including carbon and hydrogen atoms as well as ether oxygen atoms, e.g., (1) a hydrocarbon radical such as an alkylene radical, a cyclohexane radical, a 1,4-dimethylenecyclohexane radical, a phenylene radical, a 1,4-dialkylenecyclohexane radical, a 2,2-dimethylpropylene radical or the like; (2) an alkylene-O-alkylene-radical; (3) an -alkylene-O-cyclohexane-O-alkylene-radical; and the like. Exemplary diols that can be utilized in preparing these polyesters include: ethylene glycol, diethylene glycol, 1,3-propane diol, 1,4-butane diol, 1,5-pentane diol, 1,6-hexane diol, 1,7-heptane diol, 1,8-octane diol, 1,9-nonane diol, 1,10-decane diol 1,12-dodecane diol, neopentyl glycol, 1,4-cyclohexanedimethanol, and 1,4-di-$\beta$-hydroxyethoxycyclohexane. Mixtures of such diols can also be used in preparing these polyesters.

One of the dicarboxylic acid (5 to 45 mole percent of the polyester) utilized in combination with the diols in preparing these polyesters contains the light-sensitive moiety $$-CH=CH-\overset{O}{\overset{\|}{C}}-$$

Particularly useful dicarboxylic acids are those with light-sensitive moieties having the formula $$-R'-CH=CH-\overset{O}{\overset{\|}{C}}-$$

wherein R' is a divalent aryl radical such as phenylene or naphthylene, typical of such dicarboxylic acids being p-phenylene diacrylic acid. Another typical useful dicarboxylic acid having this light-sensitive moiety is fumaric acid.

The dicarboxylic acid containing the light-sensitive moiety is useful in combination with at least one additional dicarboxylic acid free of such light-sensitive moiety which is employed to substantially modify the properties of the polyester to permit its use in photothermographic transfer proceses. Such modifying dicarboxylic acids can be represented by the formula $$HO\overset{C}{\overset{\|}{C}}-R''-\overset{O}{\overset{\|}{C}}OH$$

wherein R'' is a divalent organic radical generally having about 2 to 12 carbon atoms including such hydrocarbon radicals as, (1) an alkylene radical; (2) a carbocyclic radical such as phenylene and the like. Exemplary dicarboxylic acids that can be utilized in combination with the dicarboxylic acid containing the light-sensitive moiety for preparing these polyesters include: malonic acid, succinic acid, glutaric acid, adipic acid, pimelic acid, suberic acid, azelic acid, sebacic acid, dodecanedioic acid, brassylic acid, $\alpha,\beta$-diethylsuccinic acid, $\alpha$-butyl-$\alpha$-ethyl glutaric acid, terephthalic acid, and isophthalic acid. Mixtures of such dicarboxylic acids can also be used in preparing the polyesters.

These polyesters can be prepared by esterifying a diol and a mixture of dicarboxylic acids of the type described above. Typically, the dicarboxylic acid reactants are in the form of esters of lower monohydric alcohols such as methyl, ethyl, n-propyl, n-butyl, isobutyl, isoamyl and the like. The reaction can be suitably effected in the presence of an inter-esterification catalyst such as a tetraalkyl titanate at an elevated temperature in an organic solvent in accordance with usual practice.

Suitable pigments which can be employed in the coatings of the present invention include azo pigments such as monoazo pigments and disazo pigments, phthalocyanine pigments such as copper phthalocyanine pigments, anilide pigments, azine pigments, xanthene pigments, inorganic pigments such as carbon blacks like channel blacks and furnace blacks, and the like. Representative of such pigments are Color Index Pigment Yellow 1 (CI #11680), Color Index Pigment Yelow 12 (CI #21090), Color Index Pigment Yellow 14 (CI #21095), Color Index Pigment Red 57 (CI #15850), Color Index Pigment Red 81 (CI #45160), Color Index Pigment Blue 15 (CI #74160), Color Index Pigment Black 1 (CI #50440) and Color Index Pigment Black 7 (CI #77266).

In preparing the coating compositions used in the present invention, suitable solvents can be selected from those organic solvents generally employed to prepare polymer coatings. Representative solvents include ketones such as 2-butanone, 4-methyl-2-pentanone, cyclohexanone, 4-butyrolactone, 2,4-pentadione, 2,5-hexanedione, etc.; esters such as 2-ethoxyethyl acetate, 2-methoxyethyl acetate, n-butyl acetate, etc.; chlorinated solvents such as chloroform, dichloroethane, trichloroethane, tetrachloroethane, etc.; as well as dimethylformamide and dimethylsulfoxide; and mixtures of these solvents.

Typically the light sensitive polymer is employed in the coating composition in amount of about from 1 to 20 percent by weight, based on the weight of the total composition. Preferably the polymer comprises about 2 to 10 percent by weight of the composition in a solvent such as listed above. Typically the pigment is present in the coating composition in amount of about from 0.05 to 5 percent by weight, based on the weight of the total composition. Preferably the pigment comprises 5 to 50 percent by weight of the light sensitive polymer.

In order to obtain the controlled flocculation desired in the preferred methods of preparing the coating compositions and elements of the present invention, the surfactant is employed in amounts between about 0.0015 and 2.00 percent by weight, based on the weight of the total coating composition. Preferably, the surfactant comprises 0.15 to 10.0 percent by weight of the light sensitive polymer.

The light sensitive polymers employed in this invention are compatible with, and the effectiveness of their operation can be enhanced by such known photographic addenda as sensitizers. For example, the preferred light-sensitive compositions described in the above mentioned Allen U.S. Ser. No. 709,496 can be sensitized with such materials as 6-methoxy-$\beta$-2-furyl - 2 - acrylonaphthone, Michler's ketone, Michler's thioketone, quinolizone, 2-chloroanthroquinone, 2,6 - bis(p-azidobenzal)-4-methylcyclohexanone, thiazoles, pyrylium salts, thiapyrylium salts and the like sensitizers to obtain highly sensitized photothermographic compositions. Typical suitable sensitizers are described in French Pats. 1,086,257 and 1,089,-290, and U.S. Pats. 2,610,120, 2,690,966, 2,670,285, 2,670,287, 2,670,286 and 2,732,301.

The coating compositions also can include other known photographic addenda utilized for their known purpose; such as agents to modify the flexibility of the coating, agents to modify the adhesivity of the coating to the support, antioxidants, preservatives, as well as other addenda known to those skilled in the art. These addenda can be incorporated in the coating composition either before or after the flocculation of the pigment.

The light sensitive polymer can be the sole polymeric constituent of the coating composition or another polymer can be incorporated therein to modify the physical properties of the composition and serve as a diluent. For example, phenolic resins, such as thermoplastic novolac resins, can be incorporated in the composition to improve the resistance of the polymer composition to etchants if the transferred image is to be used as a photoresist. Similarly, hydrophilic polymers such as cellulose and its derivatives, polyalkylene oxides, polyvinyl alcohol and its derivatives, etc., can be incorporated in the composition to improve the hydrophilic properties of the coating, if such properties are desired in the ultimate use to which the image is to be put. These other polymeric materials can constitute up to 25 percent by weight, based on the weight of the light sensitive polymer, of the coating composition.

Photosensitive elements of the present invention can be prepared by coating the photosensitive composition described above onto supports in accordance with usual practices. Such coating techniques as hopper coating, dip coating, spray coating, knife coating, and the like, can be employed. Coating should take place sufficiently soon after flocculation of the pigment to avoid the settling out of the flocculated pigment. Uniform dispersion of the flocculated pigment in the coating composition can be aided by gently agitating the coating composition preparatory to its being coated.

Suitable support materials onto which the coating composition can be coated to prepare the light sensitive elements of the present invention include fiber base materials such as paper, polyethylene-coated paper, polypropylene-coated paper, cloth, etc.; sheets and foils of such metals as aluminum, copper, magnesium, zinc, etc.; synthetic polymeric materials such as poly(alkyl methacrylates), e.g., poly(methyl methacrylate), polyester film base, e.g., poly(ethylene terephthalate), poly(vinyl acetals) polyamides, e.g., nylon, cellulose ester film base, e.g., cellulose nitrate, cellulose acetate, cellulose acetate propionate, cellulose acetate butyrate, and the like. The optimum coating thickness for a particular purpose will depend upon such factors as the use to which the coating will be put, the particular light sensitive polymer employed, and the nature of other components which may be present in the coating. Typically, the compositions are coated on the support at a rate of between about 0.1 to 1.0 gram per square foot. This will give dry coating thicknesses which are useful for most image reproduction processes. However, for particular applications, the compositions can be applied at a rate which will give thicker or thinner coatings.

Photographic images are prepared in accordance with the present invention by imagewise exposing the element to actinic radiation to crosslink the light sensitive polymer in the exposed areas and raise the tackifying temperature of the composition in those areas. The exposed element is then heated to a temperature intermediate between the tackifying temperature of the composition in the exposed areas of the layer and the unexposed areas of the layer to selectively render tacky the composition in the unexposed areas. The temperature to which the element is heated will generally be in the range of 50 to 200° C. The tackified composition is then transferred to a receptor surface, which can be a material similar to that used for the support.

Both transmission exposures and reflex exposures can be employed to expose the photosensitive elements. In processes using reflex exposures, the element is placed in contact with an original and light is passed from the source through the element to the original. In the image areas of the original, the light is absorbed and in the nonimage areas it is reflected back, thus further exposing the light sensitive composition. Right reading or laterally reversed images can be obtained depending upon whether the back or the front of the light sensitive element is in contact with the original. Suitable light sources which can be employed in the exposure of the element include sources rich in visible radiation and sources rich in ultraviolet radiation, such as carbon arc lamps, mercury vapor lamps, fluorescent lamps, tungsten, lamps, photoflood lamps, and the like.

The heating and transfer operation is typically carried out substantially simultaneously by placing the imagewise exposed layer of the element in contact with a receiving sheet, passing the sandwich so formed between a pair of heated pressure rollers and then separating the element from the receiving sheet which now carries the transferred image. In general these rollers preferably comprise one metal roll such as an aluminum or stainless steel roll, and one resilient roll, such as a rubber roll having a steel core. The heating of the rollers can be by means of internal heating in the metal roll or external heating or a combination of both. The temperature of the rollers is typically held within five degrees of the desired transfer temperature. The force with which the rolls are loaded can be widely varied in accordance with usual practice, although loading forces of at least about 10 pounds per linear inch of roll are generally used, with loading forces up to 50 pounds per linear inch being suitable.

Other suitable apparatus for effecting transfer of the image is described in Kodak Belgian Pat. No. 742,431, granted Jan. 30, 1970. This apparatus comprises a modified flat bed letter press printing press wherein the bed is heated and the carriage which moves over the bed carries a heated pressure roller.

It is apparent that the novel photosensitive elements have the flocculated structure of the present invention can be used to reproduce images by a number of processes in which light sensitive polymer layers are generally used. As has been shown above, these elements are particularly advantageous for use in image transfer processes, because of the increase in transfer image density obtained with the flocculated pigment structure. These transfer processes in which the elements of the present invention are particularly suitable for use are described in the above mentioned Allen U.S. Serial No. 709,496 such as the method of making multicolor reproductions described therein which involves the successive exposure and transfer of images from elements containing different colored pigments. However, novel elements prepared in accordance with the present invention will be of similar advantage in other transfer processes.

The following examples further illustrate this invention:

EXAMPLE 1

Element having flocculated pigment structure

A coating composition is prepared having the following formulation:

| | Grams |
|---|---|
| Poly(pentamethylene-bis-p-phenylene diacrylate-co-azelate) (37.5/62.5) light sensitive polymer | 20 |
| Carbon black pigment, Vulcan S.C. sold by the Cabot Co. | 3 |
| Siloxane surfactant, SF 1066 sold by the General Electric Company | 0.12 |
| 3-ethyl-2-benzoylmethylenenaphtho[1,2-d]-thiozoline sensitizer | 0.8 |
| Ethylene dichloride | 317.5 |

There is first prepared a 5 percent dispersion in ethylene dichloride of the pigment and 1 gram of the light sensitive polymer (pigment to polymer ratio 3:1). This dispersion is agitated for two hours in a high shear rotor-stator mill (sold by the Kady Co.) to break down the pigment and uniformly disperse it in the polymer solution. This dispersion is then combined with the sensitizer, the surfactant, and the remaining polymer and solvent in a "Lightnin" impeller-type mixer (sold by the Mixing Equipment Co.) and mixed for two hours. This formulation is then tumbled in a modified roll-mill which comprises a steel container rotating at about 100 r.p.m. This mixing is continued for about 15 hours prior to coating to allow optimum flocculation of the dispersion to occur. The resultant flocculated pigment coating composition is then coated on 4 mil poly(ethylene terephthalate) film support subbed with a terpolymer of 80% vinylidene chloride, 14% acrylonitrile and 6% acrylic acid, to give a dry coverage of 0.24 g./ft.$^2$. The resultant element containing the dispersion of flocculated pigment uniformly dispersed in the light sensitive layer exhibits a grainy appearance. In a similar manner light sensitive elements having the flocculated pigment structure can be prepared using other light sensitive polymers and other pigments.

EXAMPLE 2

Increased transfer density

A series of photosensitive elements are prepared as described in Example 1, using different surfactants at varying concentrations, as shown in Table 1 below. These elements are imagewise exposed to a UV source through a half tone positive transparency to crosslink the polymer in exposed areas and images are then transferred to a sheet of baryta coated paper by contacting the exposed light sensitive element with the receiving sheet and placing the sandwich thus formed on the heated bed of a modified flat bed letterpress printing machine and passing across the sandwich a heated pressure roller which is loaded with a force of about 40 pounds per linear inch and which is maintained at a temperature of about 100° C. Details as to the composition of the elements and the results observed are summarized in Table I.

TABLE I

| Coating Number | Surfactant [1] | Surfactant concentration [2] | Coating weight | Element $D_{max.}$[3] | Transfer $D_{max.}$[3] | D | Plugging [4] |
|---|---|---|---|---|---|---|---|
| 1 (Control, No flocculation) | A | 1X | 0.24 | 1.19 | 1.16 | −0.03 | Slight. |
| 2 (no flocculation) | B | 1/8X | 0.24 | 1.24 | 1.24 | 0 | Do. |
| 3 (no flocculation) | B | 1/8X | 0.30 | 1.53 | 1.38 | −0.15 | Moderate. |
| 4 (flocculation) | B | 1X | 0.24 | 1.05 | 1.27 | +0.22 | None. |
| 5 (flocculation) | B | 1X | 0.30 | 1.29 | 1.42 | +0.13 | Slight. |
| 6 (no flocculation) | C | 1/8X | 0.30 | 1.46 | 1.36 | −0.10 | Severe. |
| 7 (no flocculation) | C | 1/4X | 0.30 | 1.40 | 1.37 | −0.03 | Do. |
| 8 (flocculation) | C | 1X | 0.30 | 0.92 | 1.15 | +0.23 | Slight. |
| 9 (flocculation) | C | 4X | 0.30 | 1.01 | 1.36 | +0.35 | Do. |

[1] The surfactants employed are identified as follows: A=Modaflow, a polymeric surfactant sold by Monsanto. B=XF-1066, a copolymer of a dimethyl polysiloxane and a polyoxyalkylene ether, sold by General Electric; C=Duomeen TDO, a cationic surfactant, N-tallow trimethylene diamine dioleate, sold by Armour.

[2] The 1X level of concentration is equivalent to 0.3 gram of surfactant per 1,000 grams of coating composition.

[3] Density, $D_{max.}$, is measured with a MacBeth RD 100 Reflection Densitometer.

[4] Plugging is the unwanted transfer of polymer from the exposed areas of the element.

From Table I it can be seen that in those elements where the pigment is flocculated a substantial increase in density is obtained or transfer from the element to the receiving sheet, whereas with those elements not having the flocculated structure there is essentially no change in density or transfer or even a moderate loss in density. It can also be seen that where the pigment is not flocculated, either as a result of using insufficient amounts of the surfactant or using a surfactant which does not cause flocculation, the density of the element is generally higher than the density of elements having a flocculated structure and that there is a corresponding increase in plugging.

This invention has been described in detail with particular reference to preferred embodiments thereof, but it will be understood that variations and modifications can be effected with the spirit and scope of the invention.

What is claimed is:

1. A photosensitive element for use in an image reproduction process involving a transfer step, said element giving improved transfer image density, the element comprising a support bearing a layer of a photocrosslinkable polymer forming a continuous phase and flocculated pigment clusters forming a discontinuous phase uniformly distributed in the polymer layer.

2. A photosensitive element as defined in claim 1 wherein the photocrosslinkable polymer is a polymer containing the light sensitive grouping $$-CH=CH-\overset{\overset{O}{\|}}{C}-$$

3. A photosensitive element as defined in claim 2 wherein the photocrosslinkable polymer is a photocrosslinkable polyester having a tackifying temperature of about 50° C. to 200° C., a glass transition temperature of less than about 30° C., and a crystallinity of about 10% to 80% as determined by X-ray diffraction, the polyester containing as recurring units:

(a) 50 mole percent of at least one dihydric alcohol moiety, and (b) 50 mole percent of at least two dicarboxylic acid moieties esterified with said dihydric alcohol moiety, about 5 to 45 mole percent of said dicarboxylic acid moieties containing as integral portion a $$-CH=CH-\overset{\overset{O}{\|}}{C}-$$

grouping.

4. A photosensitive element as defined as claim 3 wherein the dicarboxylic acid moiety containing the $$-CH=CH-\overset{\overset{O}{\|}}{C}-$$

grouping is derived from a dicarboxylic acid selected from the group consisting of p-phenylene diacrylic acid and fumaric acid.

5. A photosensitive element as defined in claim 3 wherein the dihydric alcohol moiety is derived from an alcohol having the formula HO—R—OH wherein R is an alkylene radical having 2 to 12 carbon atoms, the dicarboxylic acid moiety containing the $$-CH=CH-\overset{\overset{O}{\|}}{C}-$$

grouping is derived from p-phenylene diacrylic acid and the remainder of the dicarboxylic acid moieties is derived from a dicarboxylic acid having the formula $$HO\overset{\overset{O}{\|}}{C}-R'-\overset{\overset{O}{\|}}{C}OH$$

wherein R′ is selected from the group consisting of alkylene radicals having 2 to 12 carbons atoms and phenylene radicals.

6. A photosensitive element as defined in claim 1 wherein the clusters of flocculated pigment have a mean diameter of about 0.1μ to 10μ.

7. A photosensitive element as defined in claim 1 wherein the flocculated pigment is present in amount of about 5 to 50 percent by weight, based on the weight of the photocrosslinkable polymer.

8. A photosensitive element as defined in claim 1 wherein the flocculated pigment is a carbon black pigment.

9. A photosensitive element as defined in claim 1 wherein the flocculated pigment is an azo pigment.

10. A photosensitive element as defined in claim 1 wherein the layer of photocrosslinkable polymer further contains a surfactant.

11. A photosensitive element as defined in claim 10 wherein the surfactant is a polysiloxane.

12. A photosensitive element as defined in claim 11 wherein the polysiloxane is a copolymer of dimethylpolysiloxane and a polyoxyalkylene ether.

13. A photosensitive element as defined in claim 10 wherein the surfactant is a cationic surfactant.

14. A process for preparing a photosensitive element for use in an image reproduction process involving a transfer step, the process comprising the steps of (a) mixing a surfactant with a solution of a light sensitive polymer and a pigment for a period of time sufficient to flocculate the pigment and cause it to form a discontinuous phase uniformly distributed in the polymer solution, and (b) coating the composition formed by Step (a) on a support before flocculated pigment settles out of the continuous polymer phase.

15. A process as defined in claim 14 wherein the surfactant is a polysiloxane.

16. A process as defined in claim 15 wherein the polysiloxane is a co-polymer of dimethylpolysiloxane and a polyoxyalkylene ether.

17. A process as defined in claim 14 wherein the surfactant is a cationic surfactants.

18. A process as defined in claim 14 wherein the surfactant is added to the solution in amount of about 0.0015 to 2.0 percent by weight, based on the weight of the total composition.

19. A process as defined in claim 14 wherein the photocrosslinkable polymer contains the light sensitive grouping $$-CH=CH-\overset{\overset{O}{\|}}{C}-$$

20. A process as defined in claim 19 wherein the photocrosslinkable polymer is a photocrosslinkable polyester having a tackifying temperature of about 50° C. to 200° C., a glass transition temperature of less than about 30° C., and a crystallinity of about 10% to 80% as determined by X-ray diffraction, said polyester containing as recurring units:

(a) 50 mole percent of at least one dihydric alcohol moiety, and (b) 50 mole percent of at least two dicarboxylic acid moieties esterified with said dihydric alcohol moiety, about 5 to 45 mole percent of said dicarboxylic acid moieties containing as an integral portion a $$-CH=CH-\overset{\overset{O}{\|}}{C}-$$

grouping.

21. A process as defined in claim 18 wherein the dihydric alcohol moiety is derived from an alcohol having the formula HO—R—OH wherein R is an alkylene radical having 2 to 12 carbon atoms, the dicarboxylic acid moiety containing the $$-CH=CH-\overset{\overset{O}{\|}}{C}-$$

grouping is derived from p-phenylene diacrylic acid and the remainder of the dicarboxylic acid moieties is derived from a dicarboxylic acid having the formula $$HO\overset{\overset{O}{\|}}{C}-R'-\overset{\overset{O}{\|}}{C}OH$$

wherein R′ is selected from the group consisting of alkylene radicals having 2 to 12 carbons atoms and phenylene radicals.

22. A process as defined in claim 14 wherein the light sensitive polymer comprises about 1 to 20 percent by weight of the total composition.

23. A process as defined in claim 14 wherein the pigment is a carbon black pigment.

24. A process as defined in claim 14 wherein the pigment is an azo pigment.

25. A process as defined in claim 23 wherein the pigment comprises about 0.05 to 5 percent by weight of the total composition.

26. A process for preparing a photographic image which comprises the steps of (a) imagewise exposing to actinic radiation a photosensitive element comprising a support bearing a layer of a photocrosslinkable polymer which forms a continuous phase, and flocculated pigment clusters forming a discontinuous phase uniformly distributed in the polymer layer, the exposure being sufficient to crosslink the polymer in the exposed areas of the layer and raise the tackifying temperature of the composition in those areas, (b) heating the exposed element to a temperature intermediate between the tackifying temperature of the composition in the exposed areas of the layer to selectively render tacky the composition in the unexposed areas of the layer, and (c) transferring tackified composition from the unexposed areas of the layer to a receptor surface.

27. A process as defined in claim 26 wherein the photocrosslinkable polymer contains the light sensitive $$-CH=CH-\overset{\overset{O}{\|}}{C}-$$

28. A process as defined in claim 27 wherein the photocrosslinkable polymer is a photocrosslinkable polyester having a tackifying temperature of about 50° C. to 200° C., a glass transition temperature of less than about 30° C., and a crystallinity of about 10% to 80% as determined by X-ray diffraction, said polyester containing as recurring units:

(a) 50 mole percent of at least one dihydric alcohol moiety, and (b) 50 mole percent of at least two dicarboxylic acid moieties esterified with said dihydric alcohol moiety, about 5 to 45 mole percent of said dicarboxylic acid moieties containing as an integral portion a $$-CH=CH-\overset{\overset{O}{\|}}{C}-$$

grouping.

29. A process as defined in claim 28 wherein the dihydric alcohol moiety is derived from an alcohol having the formula HO—R—OH wherein R is an alkylene radical having 2 to 12 carbon atoms, the dicarboxylic acid moiety containing the $$-CH=CH-\overset{\overset{O}{\|}}{C}-$$

grouping is derived from p-phenylene diacrylic acid and the remainder of the dicarboxylic acid moieties is derived from a dicarboxylic acid having the formula $$HO\overset{\overset{O}{\|}}{C}-R'-\overset{\overset{O}{\|}}{C}OH$$

wherein R′ is selected from the group consisting of alkylene radicals having 2 to 12 carbon atoms and phenylene radicals.

30. A process as defined in claim 26 wherein the flocculated pigment is selected from the group consisting of carbon black pigments and azo pigments.

31. A process as defined in claim 26 wherein transferring of tackified compostion is effected by the application of heat and pressure.

32. A process as defined in claim 26 wherein Steps (b) and (c) are performed substantially simultaneously by contacting the exposed element with the receptor surface and passing them through a set of heated pressure rollers.

References Cited

UNITED STATES PATENTS

| | | | |
|---|---|---|---|
| 3,060,026 | 10/1962 | Heiart | 96—28 |
| 3,030,208 | 4/1962 | Schellenberg et al. | 96—35.1 |
| 2,760,863 | 8/1956 | Plambeck, Jr. | 96—115 **X** |

NORMAN G. TORCHIN, Primary Examiner

A. T. SURO PICO, Assistant Examiner

U.S. Cl. X.R.

96—35, 115 R, 35.1

PO-1050
(5/69)

UNITED STATES PATENT OFFICE
CERTIFICATE OF CORRECTION

Patent No. 3,671,240 Dated June 20, 1972

Inventor(s) Eugene P. Gramza and David D. Schreiber

It is certified that error appears in the above-identified patent and that said Letters Patent are hereby corrected as shown below:

Column 9, line 70, after "as", ---an--- should be inserted.

Column 11, line 10, "surfactants" should read ---surfactant---.

Column 12, line 5, after "layer", ---and the composition in the unexposed areas of the layer--- should be inserted; line 11, after "sensitive", ---grouping--- should be inserted; line 54, "compostion" should read ---composition---.

Signed and sealed this 24th day of April 1973.

(SEAL)
Attest:

EDWARD M. FLETCHER, JR.
Attesting Officer

ROBERT GOTTSCHALK
Commissioner of Patents